United States Patent
Kwak et al.

(10) Patent No.: US 6,759,296 B2
(45) Date of Patent: Jul. 6, 2004

(54) METHOD OF MANUFACTURING A FLASH MEMORY CELL

(75) Inventors: Noh Yeal Kwak, Ichon-Shi (KR); Sang Wook Park, Seoul (KR)

(73) Assignee: Hynix Semiconductor Inc., Ichon-shi (KR)

( * ) Notice: Subject to any disclaimer, the term of this patent is extended or adjusted under 35 U.S.C. 154(b) by 0 days.

(21) Appl. No.: 10/286,983

(22) Filed: Nov. 4, 2002

(65) Prior Publication Data

US 2003/0119334 A1 Jun. 26, 2003

(30) Foreign Application Priority Data

Dec. 22, 2001 (KR) .......................................... 2001-83500

(51) Int. Cl.⁷ ............................................ H01L 21/336
(52) U.S. Cl. ....................................... 438/257; 438/775
(58) Field of Search ................................ 438/201, 257, 438/238, 786, 769, 775

(56) References Cited

U.S. PATENT DOCUMENTS

| | | | | |
|---|---|---|---|---|
| 5,460,992 A | * | 10/1995 | Hasegawa | .................... 438/261 |
| 2003/0003656 A1 | * | 1/2003 | Dong et al. | ................. 438/257 |

FOREIGN PATENT DOCUMENTS

KR    2001-61403    7/2001    ....... H01L/21/8247

* cited by examiner

*Primary Examiner*—Dung A. Le
(74) *Attorney, Agent, or Firm*—Jacobson Holman PLLC

(57) ABSTRACT

The present invention relates to a method of manufacturing a flash memory cell. The method includes forming a stack gate in which a floating gate and a control gate are stacked at a given region of a semiconductor substrate, and performing a rapid thermal nitrification process to form a nitride film at the side of the stack gate and over the semiconductor substrate. Therefore, the present invention can improve a retention characteristic and can prevent movement of threshold voltage control ions.

12 Claims, 1 Drawing Sheet

METHOD OF MANUFACTURING A FLASH MEMORY CELL

BACKGROUND OF THE INVENTION

1. Field of the Invention

The invention relates generally to a method of manufacturing a flash memory cell. More particularly, the invention relates to a method of manufacturing a flash memory cell capable of improving a retention characteristic and preventing movement of threshold voltage control ions, in a way that a stack gate in which a floating gate and a control gate are stacked is formed at a given region of a semiconductor substrate, and a rapid thermal nitrification process is then performed to form a nitride film at the side of the stack gate and over the semiconductor substrate.

2. Description of the Prior Art

In a flash memory device having a gate structure in which a floating gate and a control gate are isolated by a dielectric film, electric charges are stored at the floating gate using a hot carrier injection. The floating gate formed of a polysilicon film, however, has a retention fail problem by which the stored charges could not be retained due to variation in a wide range of temperature and the operating voltage.

The retention fail problem is usually generated by defective oxide film. The defective oxide film is mainly generated by the leakage of electrons due to reduction in the height of an interface barrier. Also, the leakage of the electrons is mainly generated by etching damage of an ONO film used as a dielectric film after the etch process for forming an electrode. In order to overcome this etch damage, an oxidization process using a high temperature thermal process is implemented. In addition, an ion implantation process for forming a junction region is implemented after the oxidization process.

However, during the ion implantation process, the quality of a gate oxide film is degraded by charged dopant since ions are implanted into the oxide film formed on the entire surfaces of the electrode. Further, as the junction region is increased by the oxidization process, the program speed and cell current are reduced in a flash memory device in which a program is performed through injection of large amount of hot carriers.

SUMMARY OF THE INVENTION

The present invention is contrived to solve the above problems and an object of the present invention is to provide a method of manufacturing a flash memory cell capable of improving a retention characteristic.

Another object of the present invention is to provide a method of manufacturing a flash memory cell by which the program speed and the cell current are not reduced.

Still another object of the present invention is to provide a method of manufacturing a flash memory cell in which the threshold voltage is not varied by preventing movement of threshold voltage control ions.

According to the present invention, in order to solve a problem that the quality of a dielectric film having a lower oxide film, a nitride film and an upper oxide film is degraded due to etching damage when an etch process for forming an electrode, a nitride film is formed by a rapid thermal nitrification process. Further, in order to solve a problem that the quality of the gate electrode is degraded due to implantation of an impurity ion into an oxide film that is formed around a gate electrode by a common oxidization process during an ion implantation process for forming a junction region, a thinly formed nitride film is used as a barrier layer.

In order to accomplish the above object, a method of manufacturing a flash memory cell according to the present invention, is characterized in that it comprises the steps of stacking a tunnel oxide film, a first polysilicon film, a dielectric film, a second polysilicon film and a tungsten silicide film at a given regions of a semiconductor substrate to form a stack gate in which a floating gate and a control gate are stacked; forming a nitride film at the side of the stack gate and on the semiconductor substrate by means of a rapid thermal nitrification process; and forming a junction region at a given region of the semiconductor substrate by means of an impurity ion implantation process.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

The present invention will be described in detail by way of a preferred embodiment with reference to accompanying drawings.

Figure 1A:
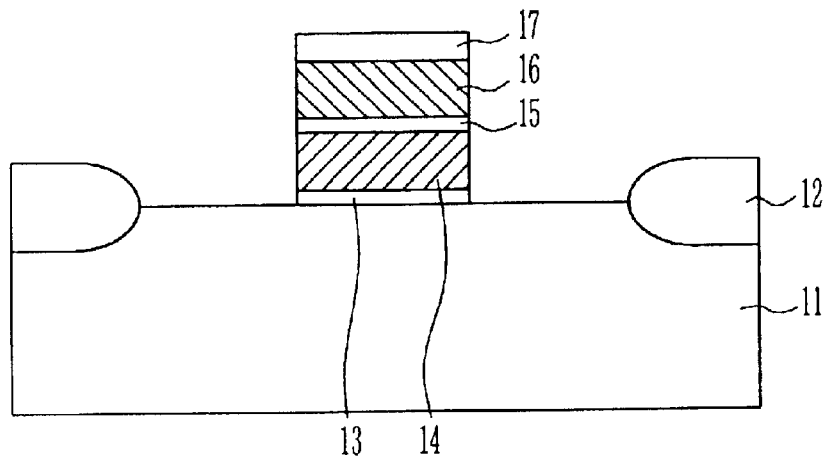
FIG. 1A~FIG. 1C are cross-sectional views of semiconductor devices explaining a method of manufacturing a flash memory cell according to the present invention.
Figure 1B:
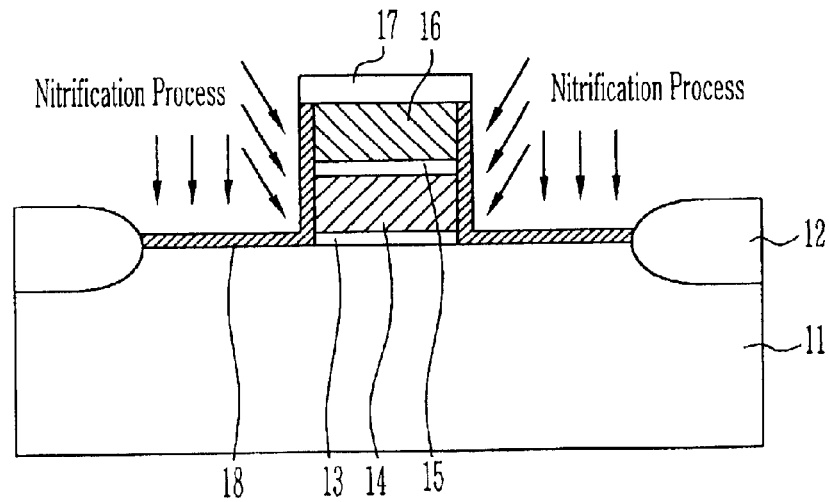
Figure 1C:
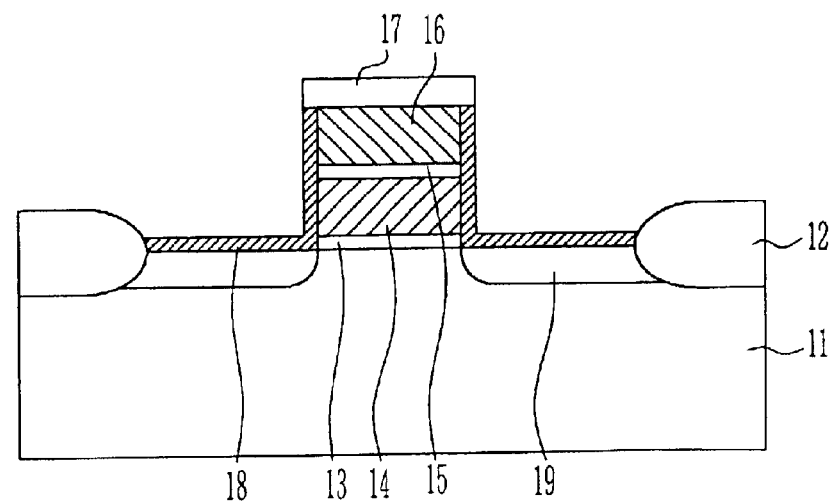

FIG. 1A~FIG. 1C are cross-sectional views of semiconductor devices for explaining a method of manufacturing a flash memory cell according to the present invention.

Referring now to FIG. 1A, a device isolation film 12 is formed at a given region of a semiconductor substrate 11 to define an active region and a field region. After an impurity ion implantation process for forming a triple well in the semiconductor substrate 11 is performed, an impurity ion implantation process for controlling the threshold voltage is performed. Next, a tunnel oxide film 13 and a first polysilicon film 14 are sequentially formed on the entire structure. The first polysilicon film 14 and the tunnel oxide film 13 are then patterned by lithography process using the floating gate mask and etching process. After a dielectric film 15 is formed on the entire structure, a second polysilicon film 16 and a tungsten silicide film 17 are sequentially formed on the dielectric film 15. Thereafter, the tungsten suicide film 17, the second polysilicon film 16, the dielectric film 15, the first polysilicon film 14 and the tunnel oxide film 13 are patterned by lithography process using the control gate mask and etching process. Thereby, a stack gate in which the floating gate and the control gate are stacked is completed.

In the above, the tunnel oxide film 13 is formed by performing a wet oxidization process at a temperature ranging from 750 to 800° C. and then an annealing process using nitrogen $N_2$ at a temperature ranging from 900 to 910° C. for 20~30 minutes. Further, the first polysilicon film 14 is formed using $SiH_4$ gas and $PH_3$ gas or $Si_2H_6$ gas and $PH_3$ gas at a temperature ranging from about 500 to 620° C. at a pressure of 0.1~1 Torr. At this time, the concentration of phosphorous P is about 1.0E20~3.0E20 atoms/cc.

Further, the dielectric film 15 has an ONO structure in which a lower oxide film, a nitride film and an upper oxide film are stacked. At this time, the lower oxide film and the upper oxide film are deposited by a LPCVD method using $DCS(SiH_2Cl_2)$ gas and $N_2O$ gas or DCS gas and NO gas as a source gas at a temperature ranging from 810 to 850° C. at a pressure of 1~3 Torr. Also, the nitride film is deposited by a LPCVD method using $Si_3N_4$ gas and $N_2O$ gas or $Si_3N_4$ gas and NO gas as a source gas at a temperature ranging from 810 to 850° C. at a pressure of 1~3 Torr.

Meanwhile, the second polysilicon film 16 is deposited by a LPCVD method using silicon source gas such as $SiH_4$, $Si_2H_6$, etc. and $PH_2$ gas at a temperature ranging from 530 to 550° C. at a pressure of below 1 Torr.

Referring now to FIG. 1B, a rapid thermal nitrification process is performed to form a nitride film 18 at the side of the stack gate and on the semiconductor substrate 11. At this time, the nitride film 18 is not formed at and/or on the tungsten suicide film 17. The rapid thermal nitrification process is performed by flowing large amount of nitrogen so that the mean free pass can be minimized in order to minimize damage of the side of polysilicon due to nitrogen source at a temperature ranging from 900 to 1000° C. at a pressure of 5~10 Torr. Meanwhile, the rapid thermal nitrification process is performed using a spike anneal of 100~150° C./sec in order to minimize a thermal effect against a raised temperature ratio. At this time, it is preferred that the thickness of the nitride film is below 50 Å.

Referring now to FIG. 1C, an impurity ion implantation process is performed to form a junction region 19 at a given region of the semiconductor substrate 11. At this time, the impurity ion implantation process for forming the junction region 19 is performed using arsenic As or phosphorous P. Also, as a deep junction is required in order to obtain large amount of cell current, the ion implantation energy of 20~50 KeV is used in case of As and the ion implantation energy of 15~40 KeV is used in case of P. Further, an impurity ion of 1E14~1E16 is injected. At this time, the impurity ion implantation is performed with a slant of 0° in order to prevent damage due to ion implantation of the side of the polysilicon film.

As mentioned above, according to the present invention, etch damage that is caused during an etch process for forming a gate electrode can be minimized by performing a rapid thermal nitrification process. A problem, that the ion for controlling the threshold voltage is changed by a heat generated in a subsequent thermal process such as a furnace thermal process for a long time, can be prevented by performing a rapid thermal nitrification process.

Further, according to the present invention, a nitride film at the side of a gate electrode and on a semiconductor substrate is formed by a rapid thermal nitrification process. Therefore, degradation in the quality of an oxide film at the side of polysilicon that is generated between upper and lower oxide films and re-oxide film constituting an existing dielectric film when an impurity ion implantation process is performed, can be prevented to improve a retention characteristic.

Meanwhile, according to the present invention, a thin nitride film used as a barrier layer is formed. Therefore, degradation of the quality of a gate electrode that is generated by implanting ions into the oxide film around the gate electrode by means of a common oxidization process when an impurity ion implantation process for forming a junction region is performed, can be prevented. In addition, the process time can be reduced by the rapid thermal nitrification process.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A method of manufacturing a flash memory cell, comprising the steps of:

stacking a tunnel oxide film, a first polysilicon film, a dielectric film, a second polysilicon film and a tungsten suicide film at a given region of a semiconductor substrate to form a stack gate in which a floating gate and a control gate are stacked;

forming a nitride film at the side of said stack gate and on said semiconductor substrate by means of a rapid thermal nitrification process; and forming a junction region at a second given region of said semiconductor substrate by means of an impurity ion implantation process;

said stacking step being performed prior to performing the step of forming the nitride film; and said step of step of forming the nitride film being performed urior to the step of forming the junction region.

2. The method as claimed in claim 1, wherein said tunnel oxide film is formed by performing a wet oxidization process at a temperature ranging from 750 to 800° C. and then an annealing process using nitrogen at a temperature ranging from 900 to 910° C. for 20~30 minutes.

3. The method as claimed in claim 1, wherein said first polysilicon film is formed using $SiH_4$ gas and $PH_3$ gas or $Si_2H_6$ gas and $PH_3$ gas at a temperature ranging from 500 to 620° C. at a pressure of 0.1~1 Torr.

4. The method as claimed in claim 1, wherein said first polysilicon film is formed so that the concentration of phosphorous is 1.0E20~3.0E20 atoms/cc.

5. The method as claimed in claim 1, wherein said dielectric film is formed by stacking a lower oxide film, a nitride film and an upper oxide film.

6. The method as claimed in claim 5, wherein said lower oxide film is formed by a LPCVD method using DCS $(SiH_2Cl_2)$ gas and $N_2O$ gas or DCS gas and NO gas as a source gas at a temperature ranging from 810 to 850° C. at a pressure of 1~3 Torr.

7. The method as claimed in claim 5, wherein sad nitride film is formed by a LPCVD method using $Si_3N_4$ gas and $N_2O$ gas or $Si_3N_4$ gas and NO gas as a source gas at a temperature ranging from 810 to 850° C. at a pressure of 1~3 Torr.

8. The method as claimed in claim 5, wherein said upper oxide film is formed by a LPCVD method using DCS $(SiH_2Cl_2)$ gas and $N_2O$ gas or DCS gas and NO gas as a source gas at a temperature ranging from 810 to 850° C. at a pressure of 1~3 Torr.

9. The method as claimed in claim 1, wherein said second polysilicon film is formed by a LPCVD method using $SiH_4$ gas or $Si_2H_6$ and $PH_2$ gas at a temperature ranging from 530 to 550° C. at a pressure of below 1 Torr.

10. The method as claimed in claim 1, wherein said rapid thermal nitrification process is performed at a temperature ranging from 900 to 1000° C. at a pressure of 1~5 Torr.

11. The method as claimed in claim 1, wherein said rapid thermal nitrification process is performed using a spike anneal of 100~150° C./sec.

12. The method as claimed in claim 1, wherein said nitride film is formed in thickness of below 50 Å.

* * * * *